(12) United States Patent
Rehammar et al.

(10) Patent No.: US 11,506,697 B2
(45) Date of Patent: Nov. 22, 2022

(54) MEASUREMENT DEVICE FOR ANTENNA SYSTEMS

(71) Applicant: BLUETEST AB, Gothenburg (SE)

(72) Inventors: Robert Rehammar, Romelanda (SE); John Kvarnstrand, Floda Gothenburg (SE); Klas Arvidsson, Mölndal (SE)

(73) Assignee: BLUETEST AB, Gothenburg (SE)

( * ) Notice: Subject to any disclaimer, the term of this patent is extended or adjusted under 35 U.S.C. 154(b) by 0 days.

(21) Appl. No.: 17/268,229

(22) PCT Filed: Jun. 17, 2019

(86) PCT No.: PCT/EP2019/065920
§ 371 (c)(1),
(2) Date: Feb. 12, 2021

(87) PCT Pub. No.: WO2020/035193
PCT Pub. Date: Feb. 20, 2020

(65) Prior Publication Data
US 2021/0318369 A1 Oct. 14, 2021

(30) Foreign Application Priority Data

Aug. 14, 2018 (SE) .................................... 1830242-2
Dec. 21, 2018 (SE) .................................... 1800247-7

(51) Int. Cl.
*G01R 29/08* (2006.01)
*H01Q 3/02* (2006.01)
(Continued)

(52) U.S. Cl.
CPC ....... *G01R 29/0871* (2013.01); *G01R 29/105* (2013.01); *H01Q 3/02* (2013.01); *H01Q 17/008* (2013.01); *H04B 17/0085* (2013.01)

(58) Field of Classification Search
CPC ..... F01R 29/10; F01R 29/105; H01Q 15/006; H01Q 15/0086; H01Q 3/02; H01Q 17/008;
(Continued)

(56) References Cited

U.S. PATENT DOCUMENTS 6,295,032 B1  9/2001  Podgorski
6,563,327 B1  5/2003  Leferink
(Continued)

FOREIGN PATENT DOCUMENTS

DE      19812923       9/1999
DE   10 2017 006972    3/2018
(Continued)

OTHER PUBLICATIONS

International Search Report for PCT/EP2019/065920 dated Oct. 30, 2019, 4 pages.
(Continued)

*Primary Examiner* — Dameon E Levi
*Assistant Examiner* — Leah Rosenberg
(74) *Attorney, Agent, or Firm* — Nixon & Vanderhye

(57) ABSTRACT

A measurement device for measuring performance of at least one antenna system in a first frequency band and in a second frequency band. The measurement device including an outer chamber having inwardly radio frequency reflective walls configured to enclose the antenna system, an inner chamber deployable inside the outer chamber, the inner chamber having radio frequency absorptive walls configured to enclose the antenna system, a first test antenna arrangement arranged inside the outer chamber and configured for a measurement operation in the first frequency band, and a second test antenna arrangement arranged inside the inner chamber and configured for a measurement operation in the second frequency band, thereby enabling measuring perfor- (Continued)

mance of the antenna system in a reflective radio frequency environment by the first test antenna arrangement and measuring performance in an essentially anechoic radio frequency environment by the second test antenna arrangement.

18 Claims, 7 Drawing Sheets

(51) Int. Cl.
  *H01Q 17/00* (2006.01)
  *H04B 17/00* (2015.01)
  *G01R 29/10* (2006.01)

(58) Field of Classification Search
  CPC .. H01Q 17/0085; G01R 29/10; G01R 29/105; G01R 29/0871; H04B 17/0085
  See application file for complete search history.

(56) References Cited

U.S. PATENT DOCUMENTS

| | | |
|---|---|---|
| 8,854,246 B1 | 10/2014 | Opperman |
| 10,044,104 B1 | 8/2018 | Bartko et al. |
| 2010/0233969 A1 | 9/2010 | Frolik et al. |
| 2014/0141727 A1 | 5/2014 | Kildal et al. |
| 2015/0048980 A1* | 2/2015 | Chin .................. G01R 1/045 343/703 |
| 2017/0012714 A1 | 1/2017 | Kildal |

FOREIGN PATENT DOCUMENTS

| | | | |
|---|---|---|---|
| EP | 3 273 257 | 1/2018 | |
| JP | H01-114099 | 5/1989 | |
| JP | 2002-196027 A | 7/2002 | |
| JP | 2010-071847 A | 4/2010 | |
| JP | 5170078 B2 * | 3/2013 | ............ G01R 31/01 |
| JP | 2013096743 A * | 5/2013 | |
| JP | 2017-510144 A | 4/2017 | |
| JP | 2017-187363 A | 10/2017 | |
| KR | 10-2010-0013307 A | 2/2010 | |
| WO | 2017/102980 A1 | 6/2017 | |

OTHER PUBLICATIONS

Written Opinion of the ISA for PCT/EP2019/065920 dated Oct. 30, 2019, 9 pages.
Motorola Mobility LLC et al., "AAS radiated performance comparison between MIMO MOTA test methodologies", 3gpp Draft; R4-135809, Nov. 11, 2013 to Nov. 16, 2013, (10 pages).
Swedish Search Report for SE 1830242-2 dated Feb. 25, 2019, 2 pages.
Swedish Search Report for SE 1800247-7 dated Jul. 22, 2019, 2 pages.
Office Action issued in Korean Patent Application No. 10-2021-7007294 dated Jul. 25, 2022.
Office Action issued in Japanese Patent Application No. 2021-507673 dated Aug. 23, 2022.
Kildal et al., "New Approach to OTA Testing: RIMP and pure-LOS Reference Environments & a Hypothesis", Presented at 7th European Conference on Antennas and Propagation (EuCAP 2013), Gothenburg, Sweden, Apr. 8-12, 2013, pp. 315-318 (5 total pages).

* cited by examiner

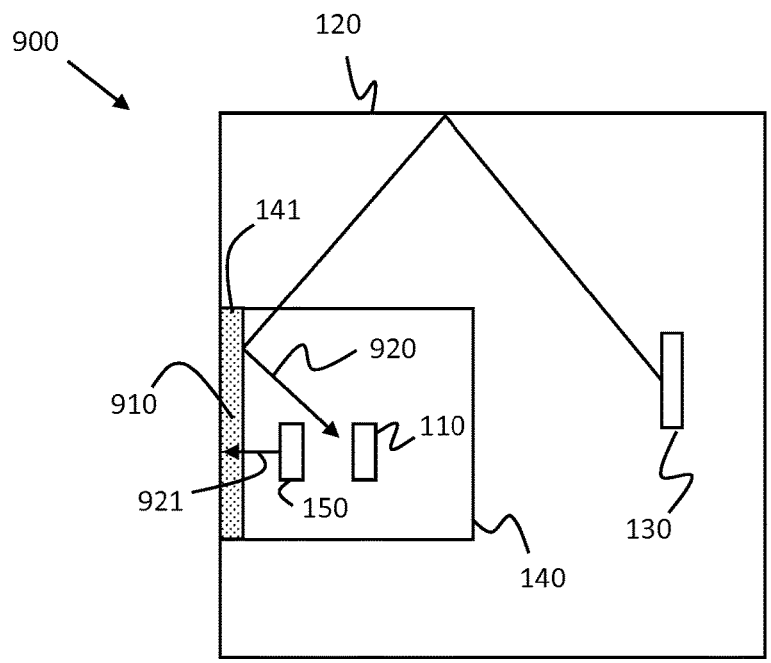
FIG. 9A
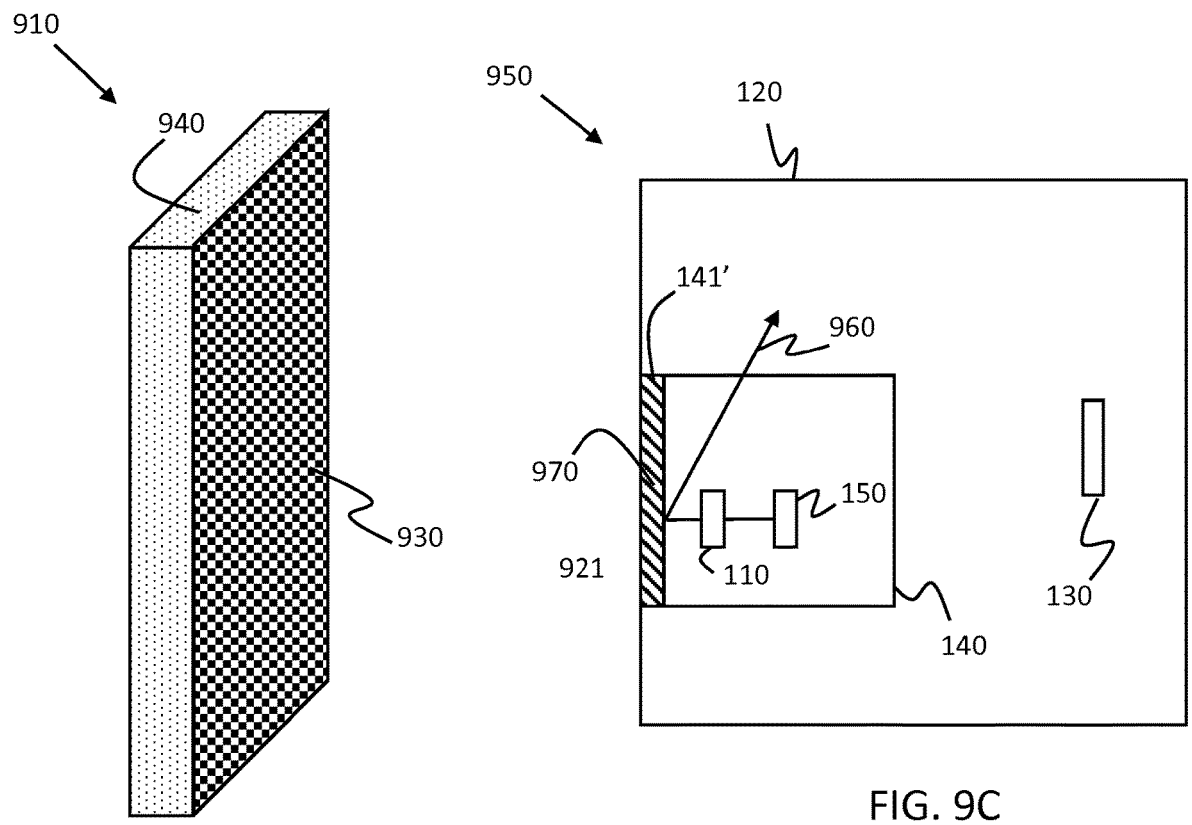
FIG. 9B
FIG. 9C

MEASUREMENT DEVICE FOR ANTENNA SYSTEMS

CROSS-REFERENCE TO RELATED APPLICATIONS

This application is the U.S. national phase of International Application No. PCT/EP2019/065920 filed Jun. 17, 2019 which designated the U.S. and claims priority to SE 1830242-2 filed Aug. 14, 2018 and SE 1800247-7 filed Dec. 21, 2018, the entire contents of each of which are hereby incorporated by reference.

TECHNICAL FIELD

The present disclosure relates to test equipment for antenna systems and wireless devices in general. There are also disclosed systems and methods for measuring the performance of antenna systems and for testing wireless devices.

BACKGROUND

Reverberation Chambers (RC), also known as electromagnetic reverberation chambers (ERC) or mode-stirred chambers (MSC) have become effective tools for measuring Over-the-Air performance of antenna systems and wireless devices. RCs are mainly used for evaluating antenna system performance in radio frequency reflective environments, i.e., when the device under test (DUT) is subjected to multipath propagation.

In an RC, the signal is injected by a test antenna arrangement into a closed chamber, or cavity, comprising inwardly radio frequency reflective walls. The signal arrives at the DUT after multiple reflections through many different trajectories. This creates a radio frequency signal fading state at the receiver. By moving mode stirring plates and/or a turntable upon which the DUT is arranged, the geometry of the chamber changes, which in turn changes the fading state that the antenna system experiences. Thus, a rich isotropic multipath (RIMP) environment is efficiently generated where a large number of fading states with different incident wave compositions can be tested.

At lower radio frequencies, such as below 6 GHz, propagation of a transmitted radio signal is usually dominated by multi-path propagation. In these scenarios, there are many propagation paths between the transmitter and the receiver. All these propagation paths combine in the receiving antenna, giving rise to fading. It is thus often desired to measure performance of a DUT in a RIMP environment in these lower frequency bands, which is conveniently created in an RC.

However, at higher radio frequencies, scattering and multi-path propagation is weaker, since there is less diffraction, less reflections and less penetrations by the environment. Because of this, the wireless channel at high frequencies, such as above 14 GHz, tends to be more line-of-sight (LOS) dominated with less scattering components. Most known RCs are not suitable for measuring performance in LOS dominated propagation environments. Rather, antenna system performance in LOS dominated channels are commonly measured in an anechoic chambers (AC), which is inherently different from an RC.

There is a need to provide simultaneous test capability for measuring performance of an antenna system in a first frequency band dominated by multipath propagation, and in a second frequency band where a strong LOS component is present.

U.S. Pat. No. 8,854,246 B1 discloses a method of converting an electromagnetic anechoic test chamber into an electromagnetic reverberation test chamber. This way performance in multipath propagation environments, as well as in LOS dominated propagation environments, can be tested. However, the proposed method is costly, time-consuming and does not allow for simultaneous testing of a plurality of relevant frequency bands.

SUMMARY

It is an object of the present disclosure to provide improved measurement devices, systems, and methods for measuring performance of at least one antenna system in a first frequency band and in a second frequency band.

This object is obtained by a measurement device for measuring performance of at least one antenna system in a first frequency band and in a second frequency band. The measurement device comprises an outer chamber having inwardly radio frequency reflective walls configured to enclose the antenna system and an inner chamber deployable inside the outer chamber.

The inner chamber has radio frequency absorptive walls configured to enclose the antenna system. A first test antenna arrangement is arranged inside the outer chamber and configured for a measurement operation in the first frequency band. A second test antenna arrangement is arranged inside the inner chamber and configured for a measurement operation in the second frequency band. The radio frequency absorptive walls are associated with a level of radio frequency signal transparency, thereby enabling measuring performance of the antenna system in a reflective radio frequency environment by the first test antenna arrangement and measuring performance in an essentially anechoic radio frequency environment by the second test antenna arrangement.

This way, the performance of an antenna system can be simultaneously measured and evaluated in a reflective propagation environment and in an essentially anechoic radio frequency environment, which is an advantage.

Some wireless communication systems use multiple carriers in a carrier aggregation configuration, where carriers can reside at frequencies in completely different bands. An example of this are the fifth-generation cellular radio systems (5G), at times referred to as New Radio (NR). NR operates at conventional frequencies below 6 GHz and at the same time supports operation at mm-wave frequencies such as at 28 GHz. The disclosed measurement devices are suitable for testing antenna systems designed for NR, in that performances in reflective and LOS dominated propagation environments can be simultaneously measured.

Advantageously, the disclosed measurement devices enable cost efficient measurement operations, since equipment for LOS dominated environments are integrated with equipment for reflective environments.

Advantageously, the disclosed measurement devices enable time efficient measurement operations, since measurements in reflective environments can be performed in parallel with measurements in LOS dominated environments.

According to aspects, the radio frequency absorptive walls are associated with a higher radio frequency signal attenuation in the second frequency band compared to in the first frequency band. Thus, impact on the measurement operation in the first frequency band by the radio frequency absorptive walls is reduced, while maintaining the anechoic properties of the measurement operation in the second frequency band. Consequently, accuracy and resolution of measurement operations is improved.

According to aspects, at least one of the radio frequency absorptive walls are arranged at a distance from the inwardly radio frequency reflective walls, thereby defining a volume between the inwardly radio frequency reflective walls and the inner chamber. The volume allows radio frequency signals in the first frequency band to propagate along a multitude of signal propagation paths, and to reflect off the inwardly radio frequency reflective walls, thereby providing or a RIMP environment in the first frequency band inside the outer chamber.

According to aspects, the measurement device comprises at least one mode stirring device arranged in the volume between the inwardly radio frequency reflective walls and the inner chamber. The at least one mode stirring device is arranged to determine a fading state of the measurement device. This way a RIMP environment state can be efficiently altered to provide for a plurality of different radio frequency signal fading states in the outer chamber.

According to aspects, any of the first test antenna arrangement and the second test antenna arrangement is configured movable in relation to the at least one antenna system. By allowing for a test antenna arrangement to move relative to the antenna system, further additional fading states and measurement geometries can be generated, which is an advantage.

According to aspects, the measurement device comprises a first displacement mechanism arranged inside the outer chamber and configured to move the at least one antenna system in relation to the first test antenna arrangement. This way even more fading states and measurement geometries can be generated, which is an advantage. The first displacement mechanism may also be configured to move the whole inner chamber. This way the at least one antenna system is moved in relation to the first test antenna arrangement, but not in relation to the second test antenna arrangement. This can be an advantage if an antenna diagram is to be evaluated in the second frequency band, while conducting a RIMP measurement in the first frequency band, since the relative test antenna arrangement geometries of the outer and the inner chamber are independent from each other.

According to aspects, the measurement device comprises a second displacement mechanism arranged inside the inner chamber and configured to move the at least one antenna system in relation to the second test antenna arrangement. This second displacement mechanism may be used to measure, e.g., an antenna diagram of the at least one antenna system in an essentially anechoic environment dominated by a strong LOS radio frequency signal component, which is an advantage.

According to aspects, the second test antenna arrangement is arranged on a probe antenna positioning device configured to position the second test antenna arrangement in relation to the antenna system. The probe antenna positioning device may optionally be arranged at least partly outside the inner chamber. This is an advantage since the anechoic properties of the inner chamber is improved by the removal of the probe antenna positioning device. Also, a more complex probe antenna positioning device can be used, since it need not fit inside the inner chamber, where space can be limited.

According to aspects, a radio frequency absorptive wall of the inner chamber comprises a carbon loaded absorber material configured with a thickness in dependence of and according to requirements of attenuation of the carbon loaded absorber material in the first and in the second frequency bands. The radio frequency signal attenuation of the carbon loaded absorber material can be controlled by selecting different thicknesses of the material to be used. A larger thickness implies stronger attenuation, and a smaller thickness implies weaker attenuation. The attenuation also varies with radio signal frequency; high frequency signals are more strongly attenuated than lower frequency signals. Thus, by selecting a thickness of the carbon loaded material used in the radio frequency absorptive walls in dependence of an attenuation of the carbon loaded absorber material in the first and in the second frequency bands, a sufficient signal attenuation in the second frequency band can be obtained at the same time as a desired signal transparency in the first frequency band is obtained.

According to aspects, the radio frequency absorptive walls of the inner chamber comprises a meta-material or a frequency selective material configured for higher radio frequency signal attenuation in the second frequency band compared to in the first frequency band. This is an advantage since the difference in attenuation between the first and the second frequency band by the absorptive walls can be increased. Ideally, for some measurement operations, the attenuation in the second frequency band is infinitely large, while attenuation in the first frequency band is non-existent.

According to aspects, the inner chamber is arranged to be removable from the outer chamber. This way, the measurement device can be easily converted to a tradition RC by physically removing the inner chamber from the outer chamber. Also, a range of different types of inner chambers can be used together with a common outer chamber, for different types of measurement operations in the second frequency band. In this case, a certain inner chamber can be selected based on the type of measurement operation to perform and inserted into the outer chamber.

According to aspects, the inner chamber comprises a frame structure arranged to releasably hold the radio frequency absorptive walls. Similar to aspects where the inner chamber is arranged removable from the outer chamber, the measurement device can now be converted into a traditional RC by removing the absorptive walls from the frame structure, which is an advantage. Also, by using different types of absorptive walls in the frame structure, different measurement operations can be configured, which is an advantage. For instance, a range of walls with different attenuation properties can be used for different types of measurement operations and for different radio frequency bands.

According to aspects, the inner chamber has a symmetric shape configured to provide an even level of radio frequency absorption in a plurality of directions. This is an advantage since measurement accuracy and measurement repeatability can be improved.

According to aspects, the radio frequency absorptive walls of the inner chamber are configured with a variable thickness determined in dependence of the shape of the inner chamber. By selecting the variable thickness in dependence of inner chamber shape, it is possible to generate a more even level of radio frequency absorption in a plurality of directions, despite irregularities in inner chamber shape, which is an advantage.

According to aspects, the inner chamber comprises one or more radio frequency reflective patches arranged on an outside face of the inner chamber and facing an inwardly radio frequency reflective wall of the outer chamber. Advantageously, the patches reduce a loading of the outer chamber, increasing accuracy of the measurement operation in the first frequency band.

According to aspects, the measurement device comprises a thermal control unit arranged to generate and to control a temperature level inside the inner chamber. Thus, the inner chamber serves the additional purpose of a temperature chamber, which is an advantage. Optionally, the walls configured to enclose the antenna system are arranged to be temperature isolating. The temperature isolating walls improve performance and energy efficiency of the temperature chamber, which is an advantage. By including temperature functionality in the measurement device, a third measurement operation comprising temperature changes can be conducted in parallel with first and second measurement operations.

According to aspects, the control unit comprises a radio frequency channel propagation emulator configured to control a temporal delay spread associated with the measurement operation in the first frequency band. The power delay spread in the inner chamber is smaller than what is common in an RC. To compensate for this a channel emulator can be utilized to increase the temporal delay spread. The spatial delay spread is still provided by the RC environment. Thus, measurement accuracy is improved, which is an advantage.

According to aspects, the control unit is arranged to divide a radio frequency test signal between the first test antenna arrangement and the second test antenna arrangement, thereby enabling a measurement operation comprising both line-of-sight, LOS, operation and rich isotropic multipath, RIMP, operation. Consequently, the measurement device is able to support advanced measurement operations comprising emulation of complex propagation environments, which is an advantage.

There is also disclosed herein methods for measuring performance of at least one antenna system in a first frequency band and in a second frequency band by a measurement device. The method comprises configuring an outer chamber with inwardly radio frequency reflective walls to enclose the antenna system, and configuring an inner chamber, deployable inside the outer chamber, with radio frequency absorptive walls to enclose the antenna system. The radio frequency absorptive walls are associated with a level of radio frequency signal transparency in the first frequency band. The method also comprises configuring a first test antenna arrangement inside the outer chamber for a measurement operation in the first frequency band, and configuring a second test antenna arrangement inside the inner chamber for a measurement operation in the second frequency band, as well as measuring performance of the antenna system in a reflective radio frequency environment by the first test antenna arrangement and measuring performance in an essentially anechoic radio frequency environment by the second test antenna arrangement.

The methods disclosed herein are associated with the same advantages as discussed above in connection to the different measurement devices. There are furthermore disclosed herein control units adapted to control some of the operations described herein.

Generally, all terms used in the claims are to be interpreted according to their ordinary meaning in the technical field, unless explicitly defined otherwise herein. All references to "a/an/the element, apparatus, component, means, step, etc." are to be interpreted openly as referring to at least one instance of the element, apparatus, component, means, step, etc., unless explicitly stated otherwise. The steps of any method disclosed herein do not have to be performed in the exact order disclosed, unless explicitly stated. Further features of, and advantages with, the present invention will become apparent when studying the appended claims and the following description. The skilled person realizes that different features of the present invention may be combined to create embodiments other than those described in the following, without departing from the scope of the present invention.

BRIEF DESCRIPTION OF THE DRAWINGS

The present disclosure will now be described in more detail with reference to the appended drawings, where FIGS. 1-4 schematically illustrate example measurement devices for measuring performance of an antenna system;

FIGS. 8A, 8B, 9A, 9B, and 9C schematically illustrate example measurement devices for measuring performance of an antenna system.

DETAILED DESCRIPTION

Figure 1:
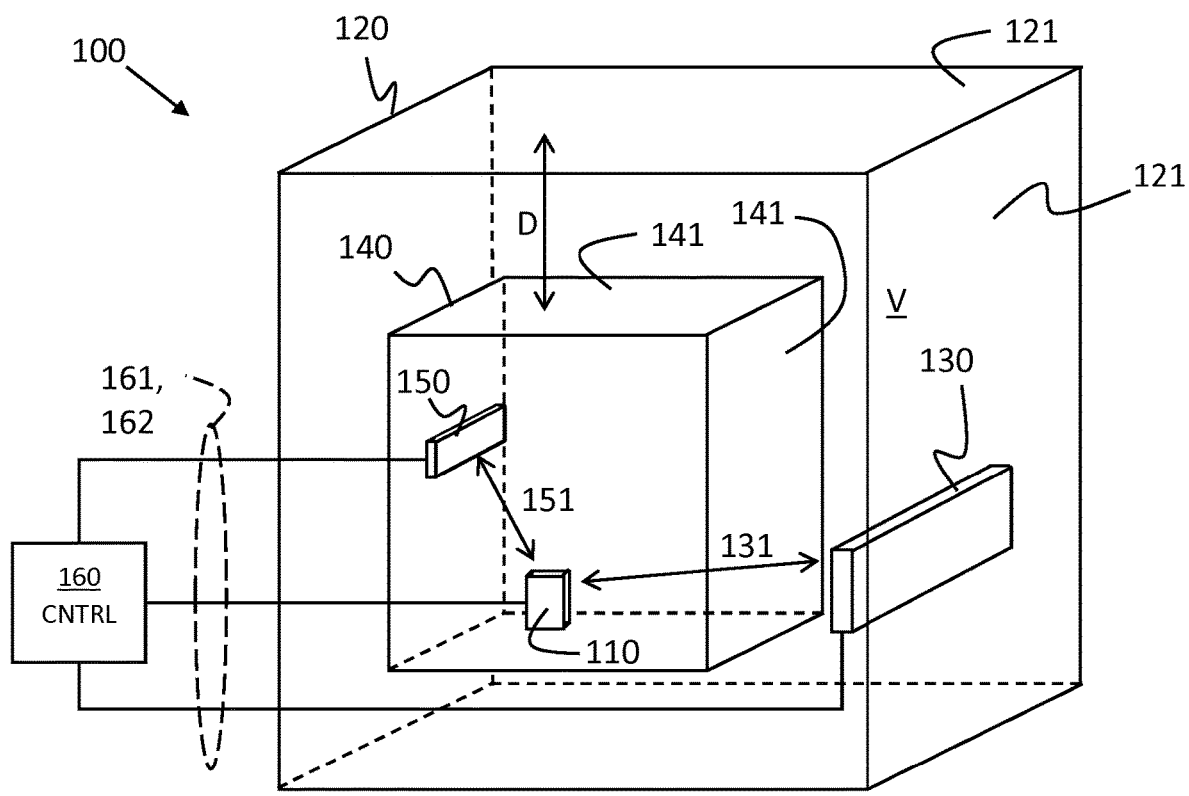

Aspects of the present disclosure will now be described more fully with reference to the accompanying drawings. The different devices and methods disclosed herein can, however, be realized in many different forms and should not be construed as being limited to the aspects set forth herein. Like numbers in the drawings refer to like elements throughout.

The terminology used herein is for describing aspects of the disclosure only and is not intended to limit the invention. As used herein, the singular forms "a", "an" and "the" are intended to include the plural forms as well, unless the context clearly indicates otherwise.

Reverberation Chambers (RCs), as mentioned above, provide a straightforward solution to testing wireless systems in multipath propagation scenarios. RCs are especially suitable for testing of devices that rely on multipath signal propagation to and from multiple antennas at transmitter and receiver for communication, known as Multiple Input Multiple Output (MIMO) and for devices that simultaneously operate using several frequency bands.

It is appreciated that test signals can be injected either by the antenna system to be tested, or by test antenna arrangements of the RC. Thus, RCs can be used for measuring both uplink and downlink radio operation.

Anechoic Chambers (ACs) have a long history as test solution for radio communication devices. An AC is a chamber or cavity enclosed by radio signal absorbing material. Its most prominent feature is that it will have a very low level of reflected signals, i.e., the opposite of the RC. ACs are commonly used when measuring over-the-air (OTA) performance where a device under test is subjected to a radio signal incident from a single direction of arrival. This method is especially suitable when it is desired to measure the antenna pattern of a device or antenna system, or metrics that are associated with the antenna pattern.

Many modern communication systems use carrier aggregation to improve radio system performance. Carrier aggregation comprises using multiple carriers, sometimes well separated in frequency, to increase available bandwidth. An example of this are the fifth generation (5G) radio systems defined by the third-generation partnership program (3GPP), sometimes denoted New Radio (NR). NR operates at conventional frequencies below 6 GHz and at the same time support operation at mm-wave frequencies such as at 28 GHz.

Further, in some modern communication systems, different types of antenna arrays are utilized where a multitude of antenna elements are used to form beams to increase the signal-to-noise ratio (SNR) of the communication signal. In many of these systems, there is no connector at the antenna port available, and hence, many parameters that could previously be tested conducted, now has to be tested over-the-air (OTA), that is, using the antenna system to be tested by operating the device and monitoring transmitted and received radio frequency signals.

At low frequencies (below 6 GHz), propagation of a transmitted signal is dominated by multi-path scattering. In these scenarios, there are many propagation paths between the transmitter and the receiver. All these propagation paths combine in the receiving antenna, giving rise to fading. It is thus often desired to measure performance of devices in rich isotropic multipath (RIMP) environments, which are conveniently created in an RC.

At high frequencies on the other hand, scattering is much weaker. There is less diffraction, less reflections and less penetrations. Because of this, the wireless channel at high frequencies tends to be more line-of-sight (LOS) dominated with less scattering components. It is thus desired to measure metrics that are associated with antenna patterns, which is conveniently done in an AC.

There is a need to provide simultaneous test capability for these communication systems where low frequency and high frequency propagation behave differently. This disclosure describes aspects of such solutions, where RIMP channel characteristics are generated using an RC and LOS-dominated channel characteristics are generated using an anechoic chamber. To generate the different channel characteristics simultaneously, an RC with an AC placed inside of it with a particular configuration is utilized.

Thus, a central concept of the methods and devices proposed herein is to place an AC which is made from a radio frequency signal absorbing material inside an RC and place the DUT inside the AC. Measurements can then be performed using one test antenna arrangement in the AC and one test antenna arrangement in the RC to transmit and/or to receive test signals from and to the DUT.

Consequently, the measurement devices disclosed herein can be configured for measuring multi-path operation performance of at least one antenna system.

Consequently, the measurement devices disclosed herein can be configured for measuring a test metric associated with an antenna pattern of the at least one antenna system.

FIG. 1 schematically illustrates a measurement device 100 for measuring performance of at least one antenna system 110 in a first frequency band and in a second frequency band.

Herein, performance of an antenna system 110 may for example refer to antenna system characteristics such as radiation diagrams, transmission coefficients, reflection coefficients, and/or S-parameters. Performance of an antenna system may also for example refer to performance on a system level, such as bit error rates (BER), packet error rates (PER) or reliability measurements such as outage. Performance may furthermore refer to standard compliance tests and the like.

The at least one antenna system is a DUT. A wireless device may comprise a plurality of antenna systems for operation in different bands. It is appreciated that several antenna systems 110 can be tested, measured, or characterized simultaneously in the proposed device.

The first and second frequency bands are usually different frequency bands but may also in some example measurement scenarios be the same frequency band.

For instance, the first frequency band may comprise lower frequencies, e.g., around 6 GHz, while the second frequency band may comprise higher frequencies, e.g., above 14 GHz.

Thus, according to some aspects, the first frequency band comprises frequencies below 6 GHz and the second frequency band comprises frequencies above 6 GHz. The second frequency band may for example comprise microwave frequencies around 28 GHz, or frequencies at E-band, i.e., around 80 GHz.

However, according to some other aspects, the first frequency band and the second frequency band comprise the same radio frequencies. This could for instance be the case when an emulated radio propagation channel should comprise a strong LOS component and more diffuse multipath in the same band.

The measurement device 100 comprises an outer chamber 120 having inwardly radio frequency reflective walls 121 configured to enclose the antenna system 110. This outer chamber is similar to known reverberation chambers configured to generate a radio frequency reflective environment.

Notably, the measurement device 100 also comprises an inner chamber 140 deployable inside the outer chamber 120. The inner chamber 140 has radio frequency absorptive walls 141 configured to enclose the antenna system 110.

As will be discussed in more detail below, the radio frequency absorptive walls are enclosing sections of radio frequency absorbing material associated with a level of radio frequency signal transparency in the first frequency band. Thus, radio frequency signals in the first frequency band penetrates the inner chamber walls to some extent, reaching the at least one antenna system 110, at the same time as the radio frequency absorptive walls attenuate radio frequency signals in the second frequency band.

According to some aspects, the radio frequency absorptive walls 141 are associated with a higher radio frequency signal attenuation in the second frequency band compared to in the first frequency band.

For example, a radio frequency absorptive wall 141 of the inner chamber 140 may be configured with a radio frequency signal attenuation of 5 dB at a radio frequency of 500 MHz, and a radio frequency signal attenuation of 15 dB at a radio frequency of 6000 MHz For example, a radio frequency absorptive wall 141 of the inner chamber 140 is configured with a radio frequency signal attenuation above approximately 20 dB for radio frequencies above 20 GHz.

According to some aspects, the radio frequency absorptive walls 141 of the inner chamber 140 comprises a meta-material or frequency selective material configured for higher radio frequency signal attenuation in the second frequency band compared to in the first frequency band.

Herein, to be deployable inside means that the inner chamber is either fixedly mounted inside the outer chamber, or removably mounted inside the outer chamber. A fixedly mounted inner chamber provides for a stable measurement set-up with a high level of repeatability, which is an advantage.

However, if the inner chamber is arranged to be removable from the outer chamber 120, then the measurement device 100 can be converted into a traditional reverberation chamber simply by removing the inner chamber from the outer chamber. Also, a range of different types of inner chambers can be used together with a common outer chamber, for different types of measurement operations in the second frequency band. The range of inner chambers may, e.g., comprise inner chambers configured with different attenuation properties for different types of measurement operations.

According to some aspects, the inner chamber 140 comprises a frame structure arranged to releasably hold the radio frequency absorptive walls 141.

This is a compromise between the inner chamber being completely removable from the outer chamber and the inner chamber being fixedly mounted inside the outer chamber. In this case a frame structure, or skeleton structure, of the inner chamber is fixedly mounted inside the outer chamber, but with radio frequency absorptive walls 141 that can be easily removed. By using different types of absorptive walls in the frame structure, different measurement operations can be configured, which is an advantage. For instance, a range of different walls or different wall sections with different properties in terms of, e.g., attenuation, can be used for different types of measurement operations and for test operation involving different radio frequency bands.

A first test antenna arrangement 130 is arranged inside the outer chamber 120 and configured for a measurement operation 131 in the first frequency band.

The first test antenna arrangement 130 excites the reverberation chamber and allows for a measurement operation in a radio frequency reflective environment, i.e., similar to a measurement operation in a traditional reverberation chamber.

A second test antenna arrangement 150 is arranged inside the inner chamber 140 and configured for a measurement operation 151 in the second frequency band. Thus, since the radio frequency absorptive walls 141 are associated with a level of radio frequency signal transparency in the first frequency band, i.e., radio signals in the first frequency band passes through the absorptive walls, it becomes possible to simultaneously measure performance of the antenna system 110 in a reflective radio frequency environment by the first test antenna arrangement 130 and measuring performance in an essentially anechoic radio frequency environment by the second test antenna arrangement 150.

Herein, the inner chamber 140 is at times referred to as the AC, while the outer chamber 120 is at times referred to as the RC. The first test antenna arrangement 130 is sometimes referred to as the RC antenna, while the second test antenna arrangement 150 is sometimes referred to as an AC probe.

According to aspects, the measurement device comprises a control unit 160 configured to control the measurement operation 131 in the first frequency band and the measurement operation 151 in the second frequency band. This control unit will be discussed in more detail below in connection to FIG. 5. It is advantageous to place the control unit and any other electronics outside of the inner chamber, which minimizes any disturbances on the measurement operation by the control unit and associated electronics.

According to some aspects, the first test antenna arrangement 130 comprises an antenna array adapted for multiple-input multiple-output, MIMO, operation in the first frequency band.

According to some other aspects, the second test antenna arrangement 150 comprises an antenna array adapted for MIMO operation in the second frequency band.

Consequently, the disclosed measurement device is suitable for MIMO measurement operations in the first and in the second frequency band. According to some aspects, the first and/or the second test antenna arrangement comprises a very large number of antenna elements, allowing for massive MIMO measurement operations.

According to some aspects, at least one of the radio frequency absorptive walls 141 are arranged at a distance D from the inwardly radio frequency reflective walls 121, thereby defining a volume V between the inwardly radio frequency reflective walls 121 and the inner chamber 140. A reverberation chamber is essentially a cavity resonator with a high Q factor. The spatial distribution of the electrical and magnetic field strengths is strongly inhomogeneous (standing waves). To reduce this inhomogeneity, one or more mode stirrers (or mode tuners) can be used. A mode stirrer is a construction with metallic or otherwise reflective elements that can be moved to different orientations in order to achieve different boundary conditions in the outer chamber. The Lowest Usable Frequency (LUF) of a reverberation chamber depends on the size of the chamber and the design of the tuner. Small chambers have a higher LUF than large chambers. Consequently, the volume V to some extent determines the Q-factor of the reverberation chamber and has an impact on the LUF value of the measurement device.

Figure 2A:
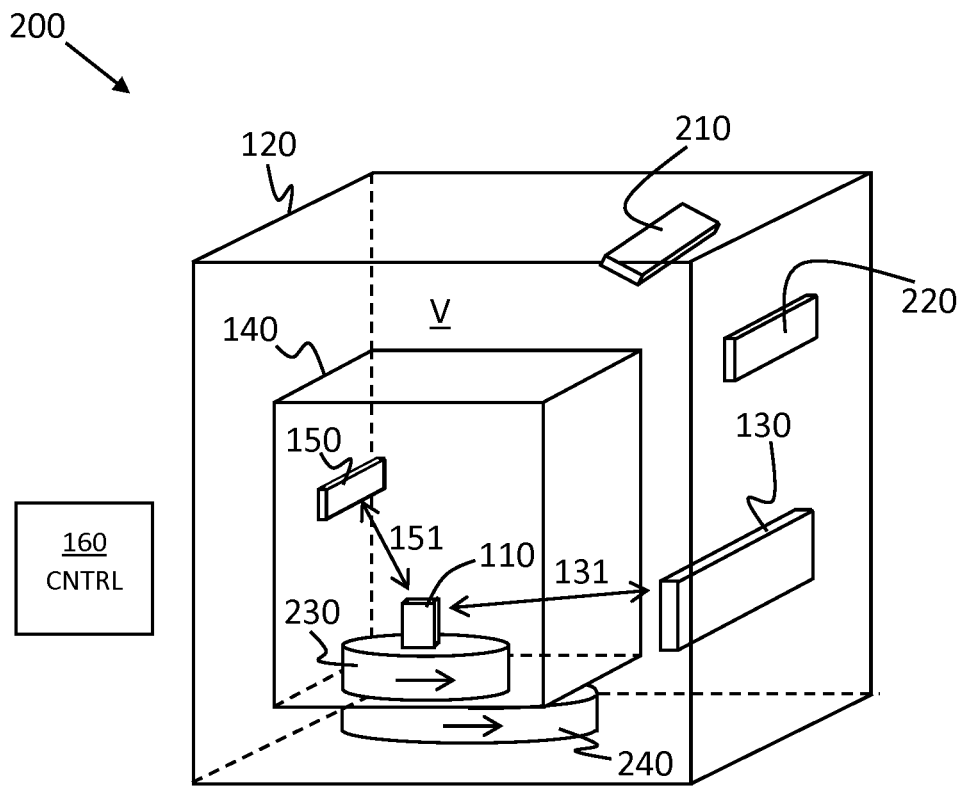
Figure 2B:
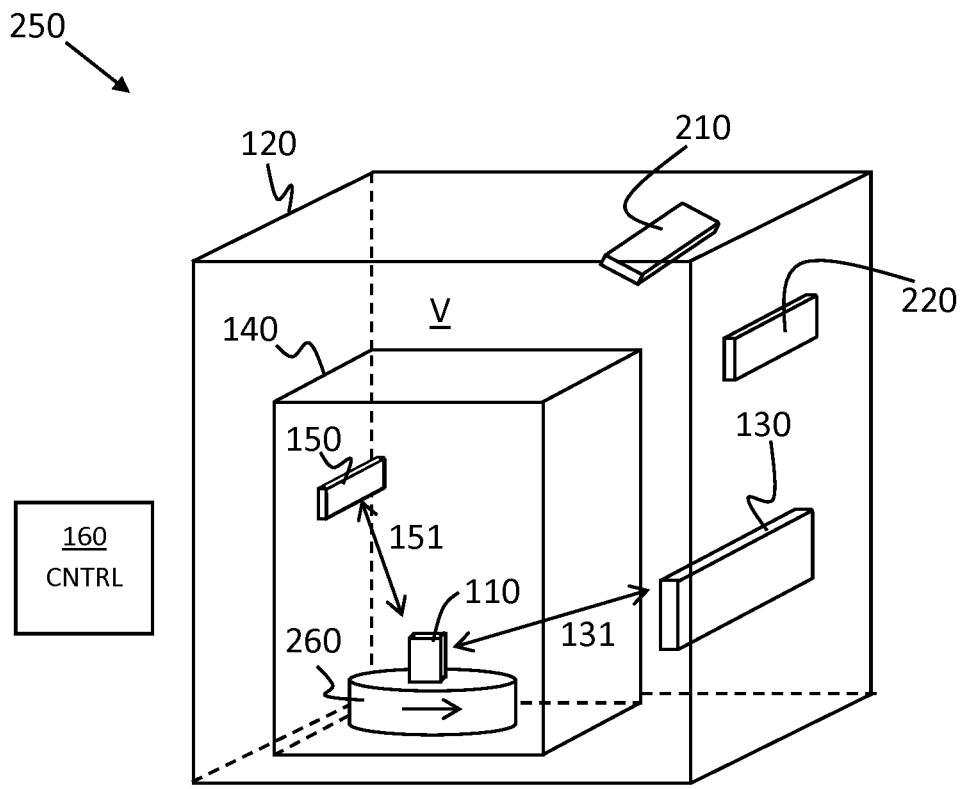

With reference to FIGS. 2A and 2B, according to some aspects, the measurement device 200, 250 comprises at least one mode stirring device 210, 220 arranged in the volume V between the inwardly radio frequency reflective walls 121 and the inner chamber 140. The at least one mode stirring device 210, 220 is arranged to determine a fading state of the measurement device 200, 250, 300. The mode stirring devices are not shown in FIG. 1 but may be deployed also in the measurement device 100 without significant modification to the design.

According to some aspects, with reference again to FIG. 1, the first test antenna arrangement 130 is arranged in the volume V between the inwardly radio frequency reflective walls 121 and the inner chamber 140, outside of the radio frequency absorptive walls 141. However, although preferred, this is not a necessary feature. Optionally, the first test antenna arrangement 130 can also be configured to be enclosed by the radio frequency absorptive walls 141 of the inner chamber 140.

According to some aspects, any of the first test antenna arrangement 130 and the second test antenna arrangement 150 is configured movable in relation to the at least one antenna system 110. Movable test antenna arrangements are associated with several advantages. For instance, by moving test antenna arrangements, the fading state of the reverberation chamber changes, since the phase relationship of reflected radio waves changes. Thus, by moving the test antenna arrangement, effects similar to that of moving a mode stirrer can be obtained. It is therefore appreciated that the mode stirrers are not an essential feature of the measurement devices disclosed herein and illustrated in FIG. 1. Also, by moving test antenna arrangements relative to the at least one antenna system 110, the antenna system or systems under test can be observed from different angles, giving a more accurate characterization of the at least one antenna system 110.

FIG. 2A illustrates an optional first displacement mechanism 240 arranged inside the outer chamber 120 and configured to move the at least one antenna system 110 in relation to the first test antenna arrangement 130. The displacement mechanism may according to some aspects comprise a turntable or the like. The displacement mechanism may according to other aspects comprise a robotic arm or similar arranged to displace the antenna system 110 according to a control signal received from, e.g., the control unit 160.

Notably, the first displacement mechanism 240 may be configured to displace the entire inner chamber 140 including the antenna system 110 and the second test antenna arrangement 150. This way, operating the first displacement mechanism 150 to displace the antenna system 110 does not affect the relative geometry of the antenna systems arranged inside the inner chamber, which is an advantage in case, e.g., simultaneous antenna diagram measurements are being made.

FIG. 2A also shows an optional second displacement mechanism 230 arranged inside the inner chamber 140 and configured to move the at least one antenna system 110 in relation to the second test antenna arrangement 150. The second displacement mechanism may according to some aspects also comprise a turntable or the like. However, as for the first displacement mechanism, the second displacement mechanism 230 may according to other aspects comprise a robotic arm or the like arranged to displace the antenna system 110 according to a further control signal received from, e.g., the control unit 160.

FIG. 2B shows an example measurement device 250 where a third displacement mechanism 260 is arranged inside the inner chamber and configured to move the at least one antenna system 110 in relation to the first 130 and second 150 test antenna arrangements. In this case a single displacement mechanism can be used to move the at least one antenna system 110 in relation to the first 130 and second 150 test antenna arrangements. The third displacement mechanism may according to aspects comprise a turntable, a robotic arm, or the like arranged to displace the antenna system 110 according to a further control signal received from, e.g., the control unit 160.

Figure 3:
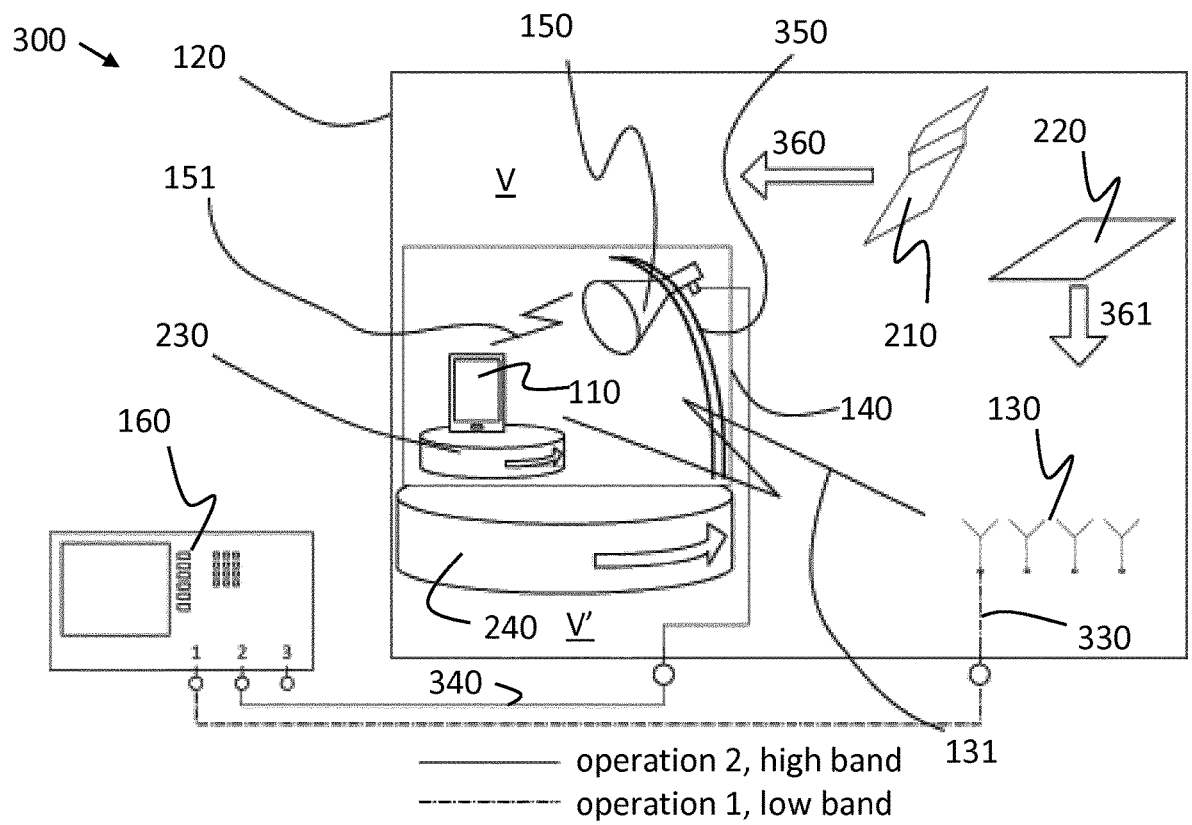

FIG. 3 illustrates another example measurement device 300. The RC or outer chamber 120 is here again designed as a regular RC with one or a multitude of fixed antennas 130 connected to the control unit 160. The control unit may comprise, e.g., a test instrument as discussed below in connection to FIG. 5. Mode stirrers 210, 220 are configured to stir or generate different RC modes in the RC chamber.

Inside the RC, an AC or inner chamber 140 is placed. The design of the AC is, according to some aspects, similar to a traditional AC, except that the AC is made essentially from absorbers only, not any shielded enclosure. Any test instruments comprised in the control unit 160 can be connected to the AC fixed antenna/probe 150 as well as the RC test antenna arrangement 130.

With this configuration, the transmission characteristics of the signal going from the first test antenna arrangement 130 to the DUT 110 will exhibit multi-path fading; resulting in a RIMP propagation channel. The transmission characteristics of the signal going from the second test antenna arrangement 150, however, will only experience a limited level of multi-path due to the radio frequency signal absorbers in the AC 140. Hence, with this configuration, two essentially independent channel characteristics can be generated simultaneously, utilizing the strengths of the RC and AC respectively to characterize the at least one antenna system 110.

As mentioned above, to create increased discrimination between the RC propagation path and the AC propagation path, the AC absorbers can optionally be made frequency selective such that frequencies aimed at the AC probe antenna 150 are attenuated more strongly compared to frequencies aimed at the RC antenna 130 when passing through the AC absorptive walls.

According to some aspects, the second test antenna arrangement 150 is arranged on a probe antenna positioning device 350 configured to position the second test antenna arrangement 150 in relation to the antenna system 110.

All the DUT-interfaces can be used from the turntable via cables into the AC. That way additional noise shielding will be provided by the attenuation in the AC walls.

Positioners and other mechanics can be placed on the displacement mechanism 240, outside the AC, making those, possible metallic, parts less disturbing to the AC environment. Thus, according to some aspects, the probe antenna positioning device 350 is arranged at least partly outside the inner chamber 140.

It is appreciated that the inner chamber 140 may optionally extend to also cover the displacement mechanism 240, in a similar way as illustrated in FIG. 2B for the third displacement mechanism 260.

Preferably, the AC probe antenna 150 and any other metallic objects in the AC are be made small enough so that radiation from the RC propagation path is not blocked for that particular direction but can e.g. diffract around the obstacles so that RC anisotropy is not introduced.

The absorbers introduced in the inner chamber 140 will decrease RC performance by changing the RC modes. Further, radiations from certain directions, e.g. the floor, where there is little RC volume V' outside of the AC, providing little propagation volume for the RC propagation path will be more attenuated in relative these directions from the DUT antenna. To reduce these effects, the AC DUT positioner 350 can be used to make the DUT experience mode stirring in according to that degree of freedom generated by the AC DUT positioner. Hence, it can be advantageous to make the AC DUT positioner contain as many degrees of freedom as possible, instead of having those degrees implemented at the AC probe antenna.

According to some aspects, the second test antenna arrangement 150 comprises a plurality of probe antennas arranged on the probe antenna positioning device 350.

The radio frequency absorptive walls can be implemented in different ways. For instance, a radio frequency absorptive walls 141 of the inner chamber 140 may comprise a carbon loaded absorber material. The thickness of this material determines radio frequency signal attenuation for a given frequency measured in dB. A thick absorptive material attenuates radio frequency signals more strongly than a thin material. A radio frequency signal absorptive material with a given thickness attenuates higher radio frequency signals more than lower radio frequency signals.

In other words, according to aspects, the carbon loaded absorber material is configured with a thickness in dependence of an attenuation and according to requirements of attenuation of the carbon loaded absorber material in the first and in the second frequency bands.

According to an example, carbon loaded absorbers of a limited thickness is used in the inner chamber, such that signals of lower frequencies will experience only a modest amount of attenuation while signals of higher frequencies will be strongly attenuated as they pass through the absorber. The structure of this material does not give any frequency selectivity by itself, but by being thin, low frequencies are less attenuated than high frequencies, and a level of radio frequency transparency is obtained.

The AC 140 can be used to significantly reduce the power delay spread from around 200 ns in an unloaded RC to around 35 ns. This heavy loading is difficult to achieve with conventional absorbing methods where absorbers are placed on the RC walls without completely destroying chamber uncertainty. This is very useful when testing, e.g., standards, systems and wireless devices which are sensitive to long delay spread for inter-symbol interference (ISI) or other reasons. Examples of such systems comprise wireless local area network systems such as the 802.11 family of systems, and the global positioning system (GPS).

The probe antenna, or second test antenna arrangement 150 in the AC or inner chamber can be made from several different probes with different characteristics mounted on different places of the AC probe antenna positioner or holder 350. E.g. there can be one probe which is a small omni-directional antenna that will have a short distance to the far field, and hence a large quiet zone. There can also be an antenna with large gain where the DUT will be located in the near field and where the quiet zone is non-existing, but where the antenna gain is needed for the wireless link. The probe antenna could even be focusing its energy on the DUT to provide additional gain. This technique can also be used to collect different polarizations where different polarized antennas are placed at different positions in the AC.

The AC absorbers or radio frequency absorptive walls of the inner chamber are preferably made to absorb radio frequency signals equally in all directions to minimize any anisotropy introduced in the chamber RC propagation paths. This can be achieved at least in part by using a symmetric shape of the chamber, e.g. cylindrical or hexagonal.

Thus, according to some aspects, the inner chamber 140 has a symmetric shape configured to provide an even level of radio frequency absorption in a plurality of directions.

Irregularities in the shape of the inner chamber can to some extent be compensated for by the selection of radio frequency signal absorptive material, and dimensions of the absorptive material. According to some aspects, the radio frequency absorptive walls 141 of the inner chamber 140 are configured with a variable thickness determined in dependence of the shape of the inner chamber 140.

Figure 4:
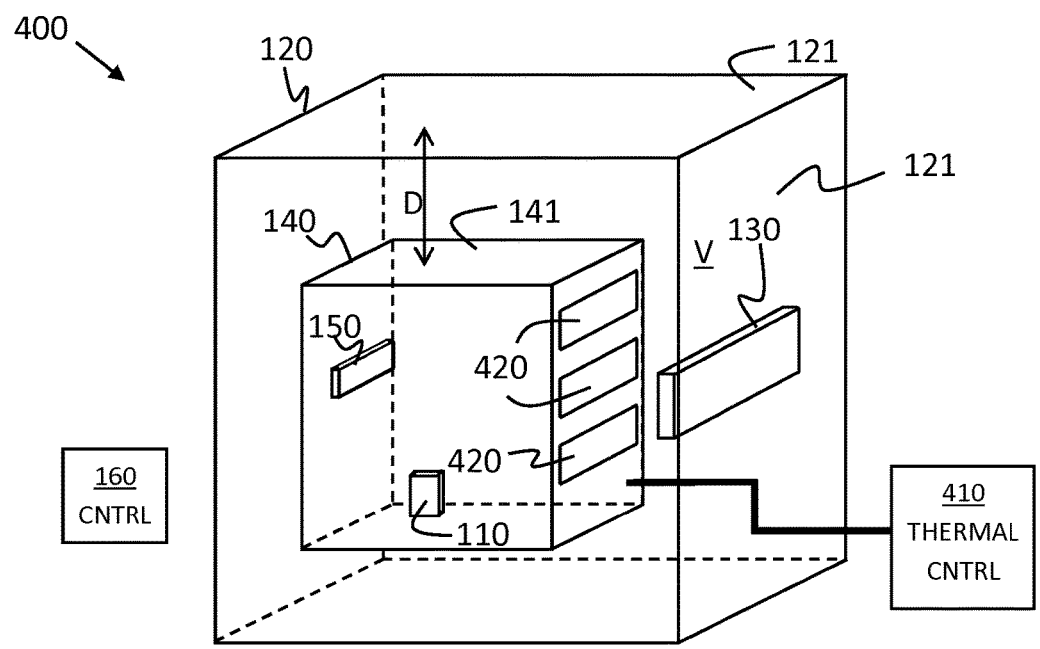

With reference to FIG. 4, to reduce the loading of the AC absorbers, they can be partially covered by metal patches 420 on the outside. This will reduce the transmission of the RC propagation path but will also reduce the loading of the outer chamber, increasing the accuracy of the RC measurement. In other words, according to aspects, the inner chamber 140 comprises one or more radio frequency reflective patches 420 arranged on an outside face of the inner chamber 140 and facing an inwardly radio frequency reflective wall 121 of the outer chamber 120.

To enable further integration of test equipment, the inner chamber can be combined with temperature test functionality. For example, the measurement device may comprise an optional thermal control unit 410 arranged to generate and to control a temperature level inside the inner chamber 140.

According to some aspects, the walls 141 configured to enclose the antenna system 110 are arranged to be temperature isolating.

It is appreciated that the walls may, according to some aspects, only be temperature isolating without being significantly radio frequency absorptive. Thus, there is disclosed herein a measurement device for measuring performance of at least one antenna system 110 in at least one frequency band. The measurement device comprises; an outer chamber 120 having inwardly radio frequency reflective walls 121 configured to enclose the antenna system 110, an inner chamber deployable inside the outer chamber, the inner chamber having temperature isolating walls configured to enclose the antenna system 110. A first test antenna arrangement 130 is arranged inside the outer chamber 120 and configured for a measurement operation 131 in a frequency band.

Figure 5:
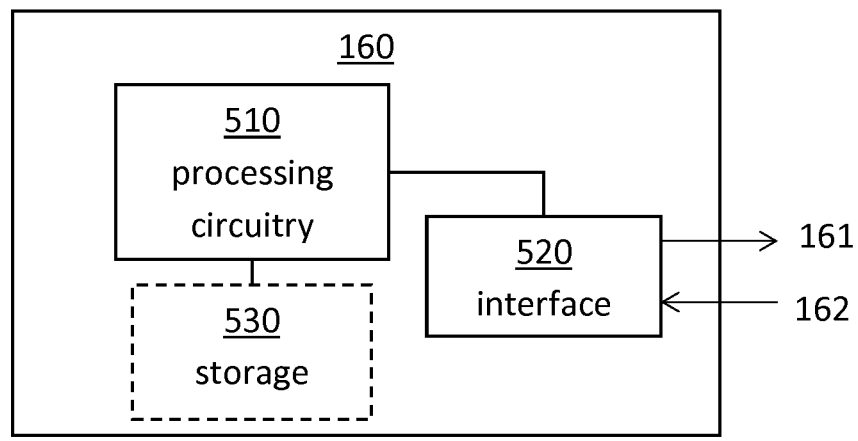
FIG. 5 shows an example control unit.

FIG. 5 schematically illustrates, in terms of a number of functional units, the components of the control unit 160 according to an embodiment of the discussions herein. Processing circuitry 510 is provided using any combination of one or more of a suitable central processing unit CPU, multiprocessor, microcontroller, digital signal processor DSP, etc., capable of executing software instructions stored in a computer program product, e.g. in the form of a storage medium 530. The processing circuitry 510 may further be provided as at least one application specific integrated circuit ASIC, or field programmable gate array FPGA.

Particularly, the processing circuitry 510 is configured to cause the control unit 160 to perform a set of operations, or steps, such as the methods discussed in connection o FIG. 7. For example, the storage medium 530 may store the set of operations, and the processing circuitry 510 may be configured to retrieve the set of operations from the storage medium 530 to cause the control unit 160 to perform the set of operations. The set of operations may be provided as a set of executable instructions. Thus, the processing circuitry 510 is thereby arranged to execute methods as herein disclosed.

The storage medium 530 may also comprise persistent storage, which, for example, can be any single one or combination of magnetic memory, optical memory, solid state memory or even remotely mounted memory.

The control unit 160 may further comprise an interface 520 for communications with at least one external device, such as the first 130 and the second 150 test antenna arrangement and the at least one antenna system 110. As such the interface 520 may comprise one or more transmitters and receivers, comprising analogue and digital components and a suitable number ports for wireline or wireless communication.

The processing circuitry 510 controls the general operation of the control unit 160 e.g. by sending data and control signals to the interface 520 and the storage medium 530, by receiving data and reports from the interface 520, and by retrieving data and instructions from the storage medium 530. Other components, as well as the related functionality, of the control node are omitted in order not to obscure the concepts presented herein.

A central function of the control unit 160 is to transmit test signals 161 via the interface 520 to, e.g., the first or second test antenna arrangement or to the at least one antenna system 110. A test signal may, e.g., comprise control signalling and data signals. The test signal may be a baseband signal, or a radio frequency signal.

The control unit may also be configured to control operation of the different displacement units 230, 240 according to a pre-determined pattern of displacement, or adaptively in response to some feedback signal.

In case the measurement device comprises temperature control functionality, then the control unit can be configured to control temperature inside the inner chamber, and/or inside the outer chamber.

The different control programs that the control unit executes can be stored in the storage medium 530.

The power delay spread in the AC is much smaller than what is usual in an RC. To compensate for that a channel emulator can be utilized increase the temporal delay spread. The spatial delay spread is still provided by the RC environment. In other words, the control unit 160 optionally comprises a radio frequency channel propagation emulator configured to control a temporal delay spread associated with the measurement operation 131 in the first frequency band. The radio frequency channel propagation emulator can be implemented by the processing circuitry 510, with instructions and data stored by the storage medium 530.

To generate a propagation environment that contains both LOS and RIMP components, signals from test equipment comprised in the control unit can be split in a ratio a/b to the AC probe antenna and the RC fixed antennas. Thereby providing both propagation paths for the signal to the DUT. This means that the control unit 160 optionally is arranged to divide a radio frequency test signal 161 between the first test antenna arrangement 130 and the second test antenna arrangement 150, thereby enabling a measurement operation comprising both line-of-sight, LOS, operation and rich isotropic multipath, RIMP, operation.

The control unit 160 is, according to some aspects, configured to simultaneously test the at least one antenna system 110 in multi-path environment via signals transmitted and received 161, 162 to and from the first test antenna arrangement 130, and in a LOS dominated radio propagation environment via signals 161,162 transmitted and received to and from the second test antenna arrangement 150.

The control unit 160 is, according to some aspects, suitable for testing wireless devices and antenna systems comprising 3GPP NR.

In summary, there is disclosed herein a control unit 160 for measuring performance of at least one antenna system 110 in a first frequency band and in a second frequency band by a measurement device 100, 200, 250, 300, 400. The measurement device comprises an outer chamber 120 having inwardly radio frequency reflective walls 121 configured to enclose the antenna system 110, an inner chamber 140 deployable inside the outer chamber 120, the inner chamber 140 having radio frequency absorptive walls 141 configured to enclose the antenna system 110, a first test antenna arrangement 130 arranged inside the outer chamber 120 and configured for a measurement operation 131 in the first frequency band, and a second test antenna arrangement 150 arranged inside the inner chamber 140 and configured for a measurement operation 151 in the second frequency band, wherein the radio frequency absorptive walls 141 are associated with a level of radio frequency signal transparency in the first frequency band, thereby enabling measuring performance of the antenna system 110 by the control unit 160 in a reflective radio frequency environment by the first test antenna arrangement 130 and measuring performance in an essentially anechoic radio frequency environment by the second test antenna arrangement 150.

Figure 6:
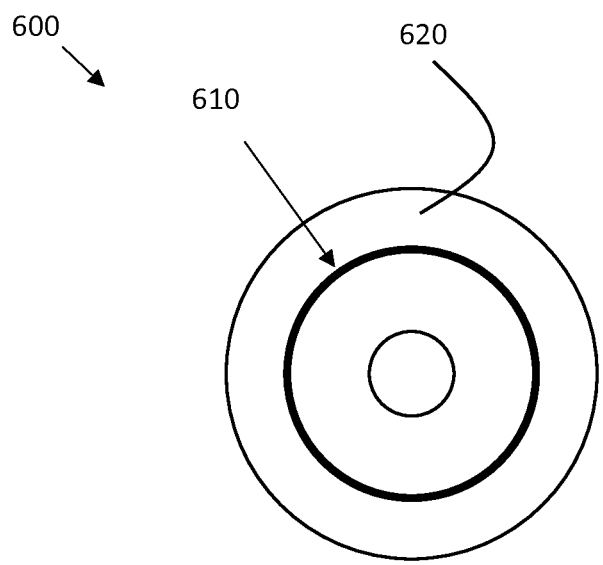
FIG. 6 illustrates a computer program product.

FIG. 6 schematically illustrates a computer program product 600, comprising a set of operations 610 executable by the control unit 160. The set of operations 610 may be loaded into the storage medium 530 in the control unit 160. The set of operations may correspond to the methods discussed below in connection to FIG. 7.

FIG. 6 shows a computer program product 600 comprising a computer program 610 according to the present teaching, and a computer readable storage medium 620 on which the computer program is stored. The computer program 610 comprises a set of operations executable by the control unit 160. The set of operations may be loaded into the storage medium 530 in the control unit 160. The set of operations may correspond to the methods discussed below in connection to FIG. 7.

In the example of FIG. 6, the computer program product 600 is illustrated as an optical disc, such as a CD (compact disc) or a DVD (digital versatile disc) or a Blu-Ray disc. The computer program product could also be embodied as a memory, such as a random-access memory (RAM), a read-only memory (ROM), an erasable programmable read-only memory (EPROM), or an electrically erasable programmable read-only memory (EEPROM) and more particularly as a non-volatile storage medium of a device in an external memory such as a USB (Universal Serial Bus) memory or a Flash memory, such as a compact Flash memory. Thus, while the computer program is here schematically shown as a track on the depicted optical disk, the computer program can be stored in any way which is suitable for the computer program product.

Figure 7:
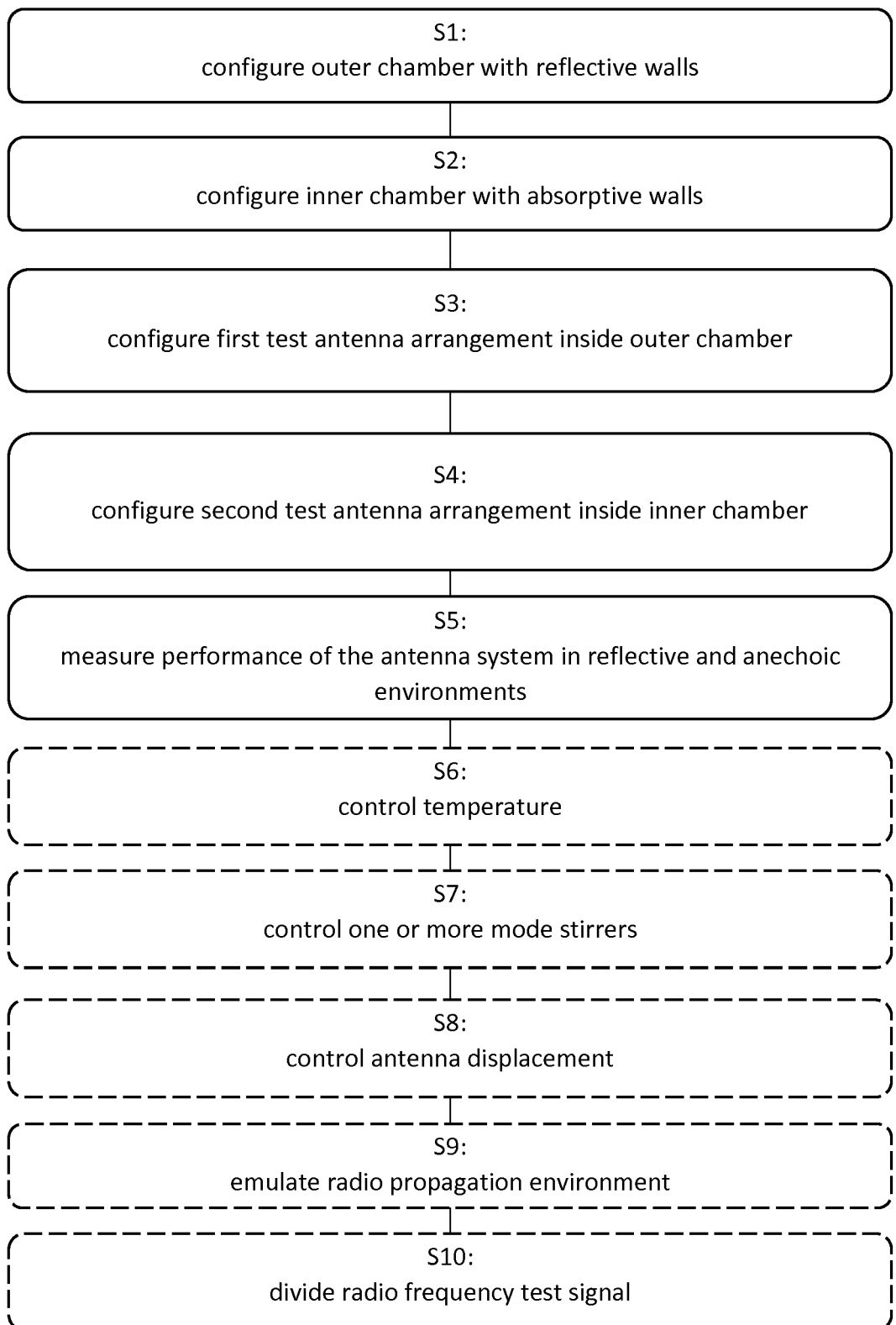
FIG. 7 is a flow chart illustrating methods.

FIG. 7 is a flow chart illustrating a method for measuring performance of at least one antenna system 110 in a first frequency band and in a second frequency band by a measurement device 100, 200, 250, 300, 400. The method comprises configuring S1 an outer chamber 120 with inwardly radio frequency reflective walls 121 to enclose the antenna system 110, configuring S2 an inner chamber 140, deployable inside the outer chamber 120, with radio frequency absorptive walls 141 to enclose the antenna system 110, wherein the radio frequency absorptive walls 141 are associated with a level of radio frequency signal transparency in the first frequency band, configuring S3 a first test antenna arrangement 130 inside the outer chamber 120 for a measurement operation 131 in the first frequency band, configuring S4 a second test antenna arrangement 150 inside the inner chamber 140 for a measurement operation 151 in the second frequency band, and measuring S5 performance of the antenna system 110 in a reflective radio frequency environment by the first test antenna arrangement 130 and measuring performance in an essentially anechoic radio frequency environment by the second test antenna arrangement 150.

According to aspects, the method comprises controlling S6 a temperature inside the measurement device by a thermal control unit 410. Temperature control was discussed above in connection to FIG. 4.

According to aspects, the method comprises controlling S7 at least one mode stirrer 210, 220. The mode stirrers were discussed above in connection to FIGS. 3 and 4.

According to aspects, the method comprises controlling S8 at least one displacement mechanism 230, 240 to adjust a relative position of the at least one antenna system in relation to any of the first and second test antenna arrangement. The displacement mechanisms were discussed above in connection to FIGS. 2A and 2B, and also FIG. 3.

According to aspects, the method comprises emulating S9 a radio frequency channel propagation environment to control a temporal delay spread associated with the measurement operation 131 in the first frequency band. This can be advantageous in situations where tests are being performed on radio standards that are sensitive to high delay spread. In a multi-path environment, different propagation paths arrive at the receiver at different times. This can cause inter-symbol interference, e.g. if the time difference between two propagation paths is larger than the communication symbol duration. In this case previous symbols can interfere with later symbols, potentially causing the communication to break down or be impaired. Systems which are sensitive to this kind of interference can be hard to test in RCs. To ease the testing, the RC signal delay spread can be reduced by placing microwave absorbing material in the RC. This is generally denoted as "tuning the delay spread". It is common to do this by placing absorbing material at the chamber walls. Enclosing the device completely in (semi-)absorbing material such as what is described herein represents a new alternative way to reduce the delay spread by a controlled significant amount. An additional advantage of this method is that since the DUT is experiencing equal attenuation in all directions, measurement accuracy is not reduced.

According to aspects, the method comprises dividing S10 a radio frequency test signal between the first test antenna arrangement 130 and the second test antenna arrangement 150, thereby enabling a measurement operation comprising both line-of-sight, LOS, operation and rich isotropic multipath, RIMP, operation.

Potentially, the second test antenna arrangements illustrated in FIGS. 1-4 do not generate very plane wave fronts. This could possibly be an issue in some testing scenarios where a plane wave front is a requirement.

Figure 8A:
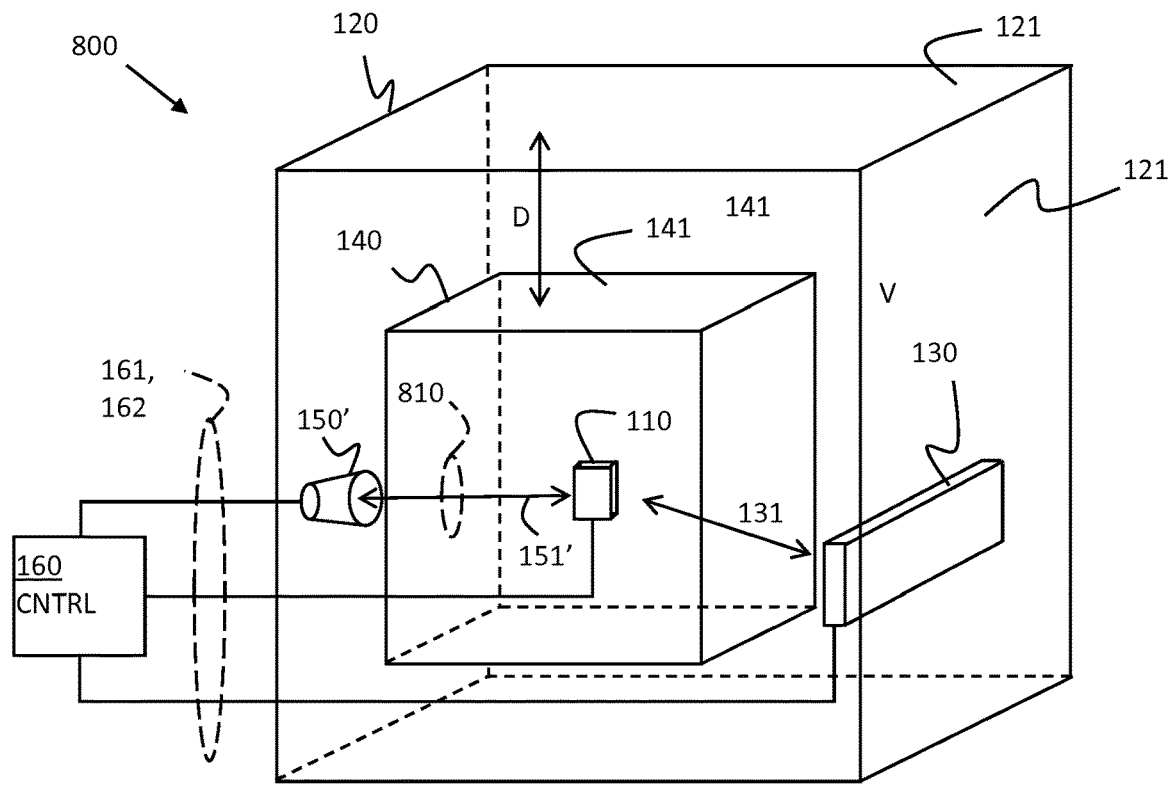

FIG. 8A shows an example measurement device 800 where part of the second test antenna arrangement 150' has been moved outside the inner chamber 140 but still located inside the outer chamber 120. The second test antenna arrangement is here a directive antenna, e.g., a horn antenna, lens horn antenna, a reflector antenna or antenna array configured with a directive radiation pattern.

The reflector antenna embodiment corresponds to a so-called Compact Antenna Test Range (CATR), which can be used to provide convenient testing of antenna systems at frequencies where obtaining far-field spacing to the antenna system 110 would be infeasible using traditional free space methods. A CATR uses a source antenna which radiates a spherical wavefront and one or more secondary reflectors to collimate the radiated spherical wavefront into a planar wavefront within the desired test zone. One typical embodiment uses a horn feed antenna and a parabolic reflector to accomplish this. CATRs are known and will not be discussed in more detail here.

An opening 810 is arranged in a wall of the inner chamber 140, such that a significant part of a main lobe of the second test antenna arrangement 150' can pass relatively unhindered into the inner chamber. This way, the effective radiation of the second test antenna arrangement is still mainly inside the inner chamber, and the second test antenna arrangement can therefore be said to be comprised in the inner chamber for all practical purposes. However, since the distance between the antenna system 110 and the second test antenna arrangement is now longer, the wave front seen by the antenna arrangement 110 for the measurement operation 151' in the second frequency band more resembles a plane wave. In other words, the measurement operation 151' in the second frequency band is now performed using a plane wave-like wave excitation having a relatively large spatial extension, which is an advantage in some testing scenarios.

To summarize, FIG. 8A shows a measurement device 800 wherein at least one of the inner chamber 140 radio frequency absorptive walls 141 has an opening 810 into the outer chamber 120. At least part of the second test antenna arrangement 150' is arranged outside the inner chamber 140 and configured as a directive antenna having a main lobe. This main lobe is arranged to be directed towards the opening 810 such that a transmission by the second test antenna arrangement 150' is arranged mainly inside the inner chamber 140, thereby enabling measuring performance of the antenna system 110 in a reflective radio frequency environment by the first test antenna arrangement 130 and measuring performance in an essentially anechoic radio frequency environment by the second test antenna arrangement 150'.

According to some aspects, the opening 810 is arranged at a distance D2 from the part of the second test antenna arrangement 150' and has a shape matched to the antenna diagram of the main lobe at the distance D2. This means that the opening is large enough to pass most of the transmitted energy from the second test antenna arrangement, but not too large in order to hamper measuring performance in an essentially anechoic radio frequency environment by the second test antenna arrangement 150'. The opening need not be circular, elliptical or other shaped openings are possible. A preferred shape of the opening can be determined via experimentation of computer simulation. The opening can also be arranged re-configurable, such that it can be adapted to different types of second test antenna arrangements having different antenna radiation patterns, or such that it can be adapted if the distance D2 changes.

Figure 8B:
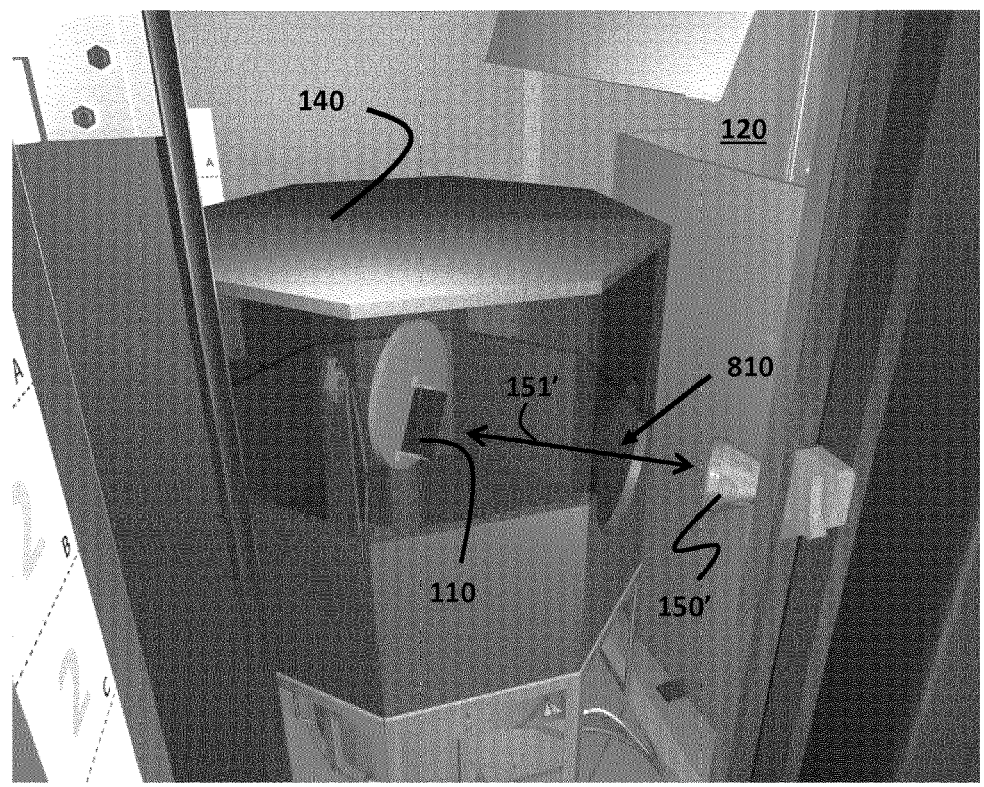

FIG. 8B illustrates an example measurement device 820 comprising the outer and inner chambers. The inner chamber 140 has the opening 810 in one of its walls. A directive antenna 150' is arranged as the second test antenna arrangement and configured to radiate into the opening 810.

It is appreciated that the example measurement devices 800 illustrated in FIGS. 8A and 8B are compatible with the above discussion. Thus, all features discussed in connection to FIGS. 1-4 are applicable also in case of an opening 810 being arranged in the inner chamber wall, with a second test antenna arrangement placed at least partly outside the inner chamber.

According to some aspects, the antenna arrangement 150 or 150' can be arranged as a reflector antenna with a main reflector, and possibly sub reflectors. This kind or arrangement is well known in antenna testing. The reflector is used to convert the spherical outgoing wave from a horn antenna to a plane wave. The arrangement is known as a compact antenna test range (CATR). This configuration is compatible with arrangements 100, 200, 250, 300, 400, 800 or 900.

A potential problem when arranging the inner chamber 140 inside the outer chamber 140 is that the RIMP environment is affected. This may be at least partly due to that there is not much space left between the walls of the outer chamber and the walls of the inner chamber, which limits the available propagation paths and therefore may affect propagation path distributions.

FIG. 9A illustrates another example measurement device 900, wherein at least a section of a radio frequency absorptive wall 141 of the inner chamber 140 is a frequency selective reflective wall 910 arranged in connection to an inwardly radio frequency reflective wall 121 of the outer chamber 120. The frequency selective reflective wall 910 is arranged to reflect radio frequency signals in the first frequency band and absorb radio frequency signals in the second frequency band, thereby enabling measuring performance of the antenna system 110 in a reflective radio frequency environment by the first test antenna arrangement 130 and measuring performance in an essentially anechoic radio frequency environment by the second test antenna arrangement 150'.

This way high frequency radio signals, such as signals in the second frequency band, propagate 921 into the frequency selective reflective wall 910 where they are attenuated, or absorbed. Lower radio frequency signals, such as radio frequency signals in the first frequency band, are reflected 920 by the frequency selective reflective wall 910. The frequency selective reflective wall 910 therefore has a more limited impact on the RIMP environment in the outer chamber compared to the measurement device examples described above, while it has an absorptive effect on the radio frequency signals in the second frequency band, and therefore acts much like the other radio frequency absorptive walls 141 of the inner chamber.

An example of the grating structure is shown in FIG. 9B;

According to some aspects, the frequency selective reflective wall 910 comprises a layer of radio frequency absorptive material 940 and a grating structure 930 arranged on a side of the frequency selective reflective wall 910 facing into the inner chamber 140, i.e., facing the DUT. The grating structure is a grid or lattice which has a dimension configured to reflect radio frequency signals in the first frequency band, while passing radio frequency signals in the second frequency band.

According to some aspects, the grating structure 930 comprises a metal framework with holes having a dimension to pass radio frequency signals in the second frequency band.

According to some aspects, the grating structure 930 comprises a honey-comb metal framework with openings having a dimension to pass radio frequency signals in the second frequency band.

According to aspects, at least a section of a wall 141' of the inner chamber 140 is a 'stealth' frequency reflective wall 970 arranged in connection to an inwardly radio frequency reflective wall 121 of the outer chamber 120. The reflective wall 970 is arranged to reflect radio frequency signals away from the antenna system 110, i.e., acting like a stealth surface, thereby enabling measuring performance of the antenna system 110 in a reflective radio frequency environment by the first test antenna arrangement 130 and measuring performance in an essentially anechoic radio frequency environment by the second test antenna arrangement 150'.

This is because the electromagnetic radiation from the second test antenna arrangement 150, 150' only reaches the antenna system 110 from a single direction. Signals from the second test antenna arrangement which reach the section of the wall 141' are reflected away from the antenna system 110. Signals inbound from other directions are attenuated by the inner chamber walls. The principle is illustrated in FIG. 9C, where the transmission 960 from the second test antenna arrangement 150 passes the antenna system 110 but is then reflected away from the antenna system 110 by the 'stealth' reflective wall 970.

According to an example, the reflective wall 970 can be realized using pyramid shapes arranged on the reflective wall, such that an incoming signal is reflected in an outbound direction at an angle.

The invention claimed is:

1. A measurement device for measuring performance of at least one antenna system in a first frequency band and in a second frequency band, the measurement device comprising:
   an outer chamber having inwardly radio frequency reflective walls configured to enclose the at least one antenna system;
   an inner chamber deployable inside the outer chamber, the inner chamber having radio frequency absorptive walls configured to enclose the at least one antenna system;
   a first test antenna arrangement disposed inside the outer chamber and configured for a measurement operation in the first frequency band; and
   a second test antenna arrangement disposed inside the outer chamber and configured for a measurement operation in the second frequency band,
   wherein the radio frequency absorptive walls are associated with a level of radio frequency signal transparency in the first frequency band,
   when the second test antenna arrangement is disposed outside the inner chamber, at least one of the radio frequency absorptive walls of the inner chamber has an opening into the outer chamber, and the second test antenna arrangement is configured as a directive antenna having a main lobe directed towards the opening such that a transmission by the second test antenna arrangement is inside the inner chamber, and
   the measurement device measures performance of the at least one antenna system in a reflective radio frequency environment by the first test antenna arrangement and in an essentially anechoic radio frequency environment by the second test antenna arrangement.

2. The measurement device according to claim 1, further comprising a first displacement mechanism disposed inside the outer chamber and configured to move the at least one antenna system in relation to the first test antenna arrangement.

3. The measurement device according to claim 2, further comprising one or more additional displacement mechanisms disposed inside the inner chamber and configured to move the at least one antenna system in relation to the second test antenna arrangement.

4. The measurement device according to claim 1, wherein the radio frequency absorptive walls of the inner chamber comprise a meta-material or frequency selective material configured for higher radio frequency signal attenuation in the second frequency band compared to radio frequency signal attenuation in the first frequency band.

5. The measurement device according to claim 1, wherein the inner chamber is configured to be removable from the outer chamber.

6. The measurement device according to claim 1, further comprising a controller configured to divide a radio frequency test signal between the first test antenna arrangement and the second test antenna arrangement, thereby enabling a measurement operation comprising both a line-of-sight operation and a rich isotropic multipath operation.

7. The measurement device according to claim 1, wherein the second test antenna arrangement is disposed outside the inner chamber, and
   the opening is arranged at a distance from the second test antenna arrangement, the opening having a shape matched to an antenna diagram of the main lobe at the distance.

8. The measurement device according to claim 1, wherein at least a section of at least one of the radio frequency absorptive walls of the inner chamber is a frequency selective reflective wall disposed in connection to at least one of the inwardly radio frequency reflective walls of the outer chamber, the frequency selective reflective wall being configured to reflect radio frequency signals in the first frequency band and absorb radio frequency signals in the second frequency band, thereby enabling measuring performance of the at least one antenna system in the reflective radio frequency environment by the first test antenna arrangement and measuring performance in the essentially anechoic radio frequency environment by the second test antenna arrangement.

9. A method for measuring performance of at least one antenna system in a first frequency band and in a second frequency band by a measurement device, the method comprising:
   configuring an outer chamber with inwardly radio frequency reflective walls to enclose the at least one antenna system;

configuring an inner chamber, deployable inside the outer chamber, with radio frequency absorptive walls to enclose the at least one antenna system, the radio frequency absorptive walls being associated with a level of radio frequency signal transparency in the first frequency band;

configuring a first test antenna arrangement inside the outer chamber for a measurement operation in the first frequency band;

configuring a second test antenna arrangement inside or outside the inner chamber for a measurement operation in the second frequency band;

when the second test antenna arrangement is disposed outside the inner chamber,
- arranging an opening into the outer chamber on at least one of the radio frequency absorptive walls of the inner chamber, and
- configuring the second test antenna arrangement as a directive antenna having a main lobe directed towards the opening such that a transmission by the second test antenna arrangement is inside the inner chamber; and measuring the performance of the at least one antenna system in a reflective radio frequency environment by the first test antenna arrangement and in essentially anechoic radio frequency environment by the second test antenna arrangement.

10. The measurement device according to claim 2, wherein the radio frequency absorptive walls of the inner chamber comprise a meta-material or frequency selective material configured for higher radio frequency signal attenuation in the second frequency band compared to radio frequency signal attenuation in the first frequency band.

11. The measurement device according to claim 3, wherein the radio frequency absorptive walls of the inner chamber comprise a meta-material or frequency selective material configured for higher radio frequency signal attenuation in the second frequency band compared to radio frequency signal attenuation in the first frequency band.

12. The measurement device according to claim 2, wherein the inner chamber is configured to be removable from the outer chamber.

13. The measurement device according to claim 3, wherein the inner chamber is configured to be removable from the outer chamber.

14. The measurement device according to claim 4, wherein the inner chamber is configured to be removable from the outer chamber.

15. The measurement device according to claim 2, further comprising a controller configured to divide a radio frequency test signal between the first test antenna arrangement and the second test antenna arrangement, thereby enabling a measurement operation comprising both a line-of-sight operation and a rich isotropic multipath operation.

16. The measurement device according to claim 3, further comprising a controller configured to divide a radio frequency test signal between the first test antenna arrangement and the second test antenna arrangement, thereby enabling a measurement operation comprising both a line-of-sight operation and a rich isotropic multipath operation.

17. The measurement device according to claim 4, further comprising a controller configured to divide a radio frequency test signal between the first test antenna arrangement and the second test antenna arrangement, thereby enabling a measurement operation comprising both a line-of-sight operation and a rich isotropic multipath operation.

18. The measurement device according to claim 5, further comprising a controller configured to divide a radio frequency test signal between the first test antenna arrangement and the second test antenna arrangement, thereby enabling a measurement operation comprising both a line-of-sight operation and a rich isotropic multipath operation.

* * * * *